United States Patent
Nakashima

(10) Patent No.: US 7,733,079 B2
(45) Date of Patent: Jun. 8, 2010

(54) CLOCK DISTRIBUTION CIRCUIT AND TEST METHOD

(75) Inventor: Hidemi Nakashima, Kanagawa (JP)

(73) Assignee: NEC Electronics Cofrporation, Kawasaki, Kanagawa (JP)

( * ) Notice: Subject to any disclaimer, the term of this patent is extended or adjusted under 35 U.S.C. 154(b) by 294 days.

(21) Appl. No.: 11/902,746

(22) Filed: Sep. 25, 2007

(65) Prior Publication Data

US 2008/0284483 A1 Nov. 20, 2008

(30) Foreign Application Priority Data

Sep. 27, 2006 (JP) ............................... 2006-262716

(51) Int. Cl.
*G01R 19/00* (2006.01)
(52) U.S. Cl. .................................. 324/76.11; 327/295
(58) Field of Classification Search ............. 324/76.11, 324/765, 73.1; 327/295
See application file for complete search history.

(56) References Cited

U.S. PATENT DOCUMENTS

2005/0134353 A1* 6/2005 Tahara ........................ 327/295

FOREIGN PATENT DOCUMENTS

JP 2003-92352 3/2003

* cited by examiner

*Primary Examiner*—Vincent Q Nguyen
(74) *Attorney, Agent, or Firm*—McGinn IP Law Group, PLLC

(57) ABSTRACT

A clock distribution circuit having plural stages of buffers disposed along branch paths for dividing up a clock signal and configured in a manner that outputs of a plurality of buffers in a final stage and/or a middle stage are short-circuited, includes in relation to at least one buffer of a plurality of buffers in the same stage on a branch path, a selector for receiving an output of an adjacent buffer located upstream in terms of chain-connection along which the plurality of buffers are connected in testing, and a signal at a branch node corresponding to the at least one buffer by a first input and a second input respectively, selecting one of the first input and the second input based on a select control signal, and supplying the selected input to the one buffer.

20 Claims, 4 Drawing Sheets

RELATED ART

CLOCK DISTRIBUTION CIRCUIT AND TEST METHOD

BACKGROUND OF THE INVENTION

1. Field of the Invention

The present invention relates to a mesh clock distribution circuit and a test method of the same.

2. Description of the Related Art

As IT (Information Technology) has rapidly progressed, transmission rate at which data is transmitted through transmission lines is increasingly enhanced. Therefore, functionality of processing on a large scale in a high speed is required for electronic circuits installed in devices connected to transmission lines. In design of an electronic circuit for implementing the functionality, distribution of a high speed clock having a small skew to many flip-flops (FF) may allow the design to be easy.

As one of clock distribution structures for the purpose, a mesh structure is conventionally used in which outputs of buffers in a relay stage or a final stage are short-circuited to reduce a skew, distributing a clock to flip-flops (FF).

FIG. 4 is a view illustrating a configuration of a clock distribution circuit disclosed in Japanese Patent Laid-Open No. 2003-92352 (FIG. 1). A clock signal is input to clock buffers 105 for driving mesh wiring through a clock buffer tree 107, and an output of each clock buffer 105 is supplied to each of cross points of a clock mesh 104 disposed on a chip.

The clock buffer tree 107 distributes the clock signal so that an input clock signal to each clock buffer 105 for the mesh wiring all has a uniform delay. An input terminal of each buffer 109 in a final stage for supplying a clock, is connected to a wiring part between the cross points of a clock mesh 104, and an output of each buffer 109 in the final stage is input, as the clock signal, to a flip-flop (FF) 108 disposed in the chip, whereby the skew is reduced.

SUMMARY

A conventional clock distribution circuit shown in FIG. 4 has the following problem. That is, the conventional clock distribution circuit has a mesh structure in which outputs of clock buffers 105 in one preceding stage of final stage buffers 109 are short-circuited, therefore, when several of the clock buffers 105 break down due to some reasons, it is difficult to find out a buffer which broke down.

The present invention disclosed herein, to solve the problem described above, generally includes the following configuration.

A clock distribution circuit according to the present invention having plural stages of buffers disposed on a path for dividing up a clock signal, and configured in a manner that outputs of a plurality of buffers in a final stage and/or a middle stage are short-circuited, includes:

in relation to at least one buffer of a plurality of buffers in the same stage on a branch path, a selector for receiving an output of an adjacent buffer located upstream when the plurality of buffers are connected in series (chain-connection), and a signal at a branch node corresponding to the at least one buffer by a first input and a second input respectively, selecting one of the first input and the second input based on a select control signal, and supplying the selected input to the one buffer, in which upon testing, a signal at the corresponding branch node is input to one buffer of the plurality of buffers in the same stage directly or indirectly through the selector which selects the second input, the second input being the signal at the branch node, an output of the one buffer is input to the first input of an adjacent selector located downstream in the chain-connection, the first input is selected in the adjacent selector, and the output of the one buffer is input to an adjacent buffer, the output of the one buffer, which is at a starting point of the chain-connection, is transferred up to a buffer at an ending point of the chain-connection sequentially through a selector and a buffer located downstream in the chain-connection, and a circuit for observing an output of the buffer at the ending point of the chain-connection is provided.

The clock distribution circuit according to the present invention includes, in relation to the plurality of buffers in the same stage on the branch path, a switch for disconnecting a connection to a subsequent stage, correspondingly to each of the buffers.

The clock distribution circuit according to the present invention includes, in relation to the plurality of buffers in the same stage on the branch path, a switch for connecting and disconnecting between the buffer and an input of a buffer in a subsequent stage, and between the buffer in the final stage and a flip-flop for receiving an output of the buffer in the final stage when the plurality of buffers in the same stage on the branch path are buffers in the final stage, respectively, correspondingly to each of the buffers.

The clock distribution circuit according to the present invention may be configured in a manner that a pair of flip-flop circuits for observation is provided to respectively sample the first and second inputs of the selector.

The clock distribution circuit according to the present invention may be configured in a manner that outputs of a plurality of buffers in the same stage in the middle stage on the branch path are short-circuited. In this case, to the first and second inputs of the selector provided in relation to one buffer located in a stage subsequent to the middle stage having the plurality of buffers of which outputs are short-circuited, the output of the adjacent buffer located upstream when connected in the chain-connection, and a signal at a short-circuiting point of a plurality of buffers in a previous stage corresponding to the one buffer are input.

The clock distribution circuit according to the present invention having plural stages of buffers on a path for dividing up a clock signal, and configured in a manner that outputs of a plurality of buffers in a final stage and/or a middle stage are short-circuited includes:

a first buffer and a second buffer respectively on a first path and a second path which branch at a branch node, a first switch for connecting and disconnecting between an output of the first buffer, and an input of a buffer in a subsequent stage or a flip-flop, a second switch for connecting and disconnecting between an output of the second buffer, and an input of a buffer in a subsequent stage or a flip-flop, a first selector which receives the output of the first buffer and a signal at the branch node respectively by a first input and a second input, and selects one of the first input and the second input to output, based on a select control signal, and an observation circuit for observing an output of the first selector.

The clock distribution circuit according to the present invention may include:

a third buffer and a fourth buffer respectively on a third path and a fourth path which branch at a second branch node at which an output of the first switch branches, a third switch for connecting and disconnecting between an output of the third buffer, and an input of a buffer in a subsequent stage or a flip-flop, a fourth switch for connecting and disconnecting between an output of the fourth buffer, and an input of a buffer in a subsequent stage or a flip-flop, a second selector which receives the output of the third buffer and a signal at the second branch node respectively by a first input and a second input, and selects one of the first input and the second input to output, based on a second select control signal, a fifth buffer and a sixth buffer respectively on a fifth path and a sixth path which branch at a third branch node at which an output of the second switch branches, a fifth switch for connecting and disconnecting between an output of the fifth buffer, and an input of a buffer in a subsequent stage or a flip-flop, a sixth switch for connecting and disconnecting between an output of the sixth buffer, and an input of a buffer in a subsequent stage or a flip-flop, a third selector which receives the output of the fourth buffer and a signal at the third branch node respectively by a first input and a second input, and selects one of the first input and the second input to output, based on a third select control signal, a fourth selector which receives the output of the fifth buffer by a first input and the signal at the third branch node by a second input, and selects one of the first input and the second input to output, based on a fourth select control signal, and a second observation circuit for observing the output of the sixth buffer.

The clock distribution circuit according to the present invention may further include a pair of observation circuits for individually observing each of the first and second inputs of the first selector.

The clock distribution circuit according to the present invention may include a pair of observation circuits for individually observing each of the first and second inputs of the second to fourth selectors, correspondingly to each of the second to fourth selectors.

In the clock distribution circuit according to the present invention, each of the buffers is an inverting buffer composed of an inverter circuit.

The clock distribution circuit according to the present invention may further include a flip-flop circuit for observation to sample a signal at a short-circuiting point at which outputs of the plurality of buffers in the final stage are short-circuited.

A method according to the present invention is a test method for a clock distribution circuit including plural stages of buffers on a path for dividing up and distributing a clock signal, and configured in a manner that outputs of a plurality of buffers in a final stage and/or a middle stage are short-circuited, including the steps of:

in relation to at least one buffer of a plurality of buffers in the same stage on a branch path, providing a selector which receives an output of an adjacent buffer located upstream when the plurality of buffers are connected in a chain-connection, a signal at a branch node corresponding to the one buffer by a first input and a second input respectively, selects one of the first input and the second input, based on a select control signal, and supplies it to the one buffer, upon testing, inputting a signal at the corresponding branch node to one buffer of the plurality of buffers in the same stage, sequentially transferring an output of the one buffer which is at a starting point in the chain-connection, up to a buffer at an ending point in the chain-connection through a selector and a buffer located downstream in the chain-connection, in a manner that the output of the one buffer is input to the first input of an adjacent selector located downstream in the chain-connection, then in the adjacent selector, the first input is selected and the output of the one buffer is input to an adjacent buffer, and observing an output of the buffer at the ending point in the chain-connection.

The method according to the present invention may include the step of, in relation to at least one of the plurality of buffers in the same stage on the branch path, supplying a test signal to an input terminal of the clock distribution circuit, with blocking passing to a subsequent stage.

The present invention may further include the step of: respectively observing the first and second inputs of the selector.

According to the present invention, a failure of an inverter (or buffer) of each element can be detected by sampling using a flip-flop circuit for observation, with sequentially connecting clock buffers in the same stage in a chain-connection in a clock distribution circuit having a mesh structure.

DETAILED DESCRIPTION OF THE PREFERRED EMBODIMENTS

Figure 1:
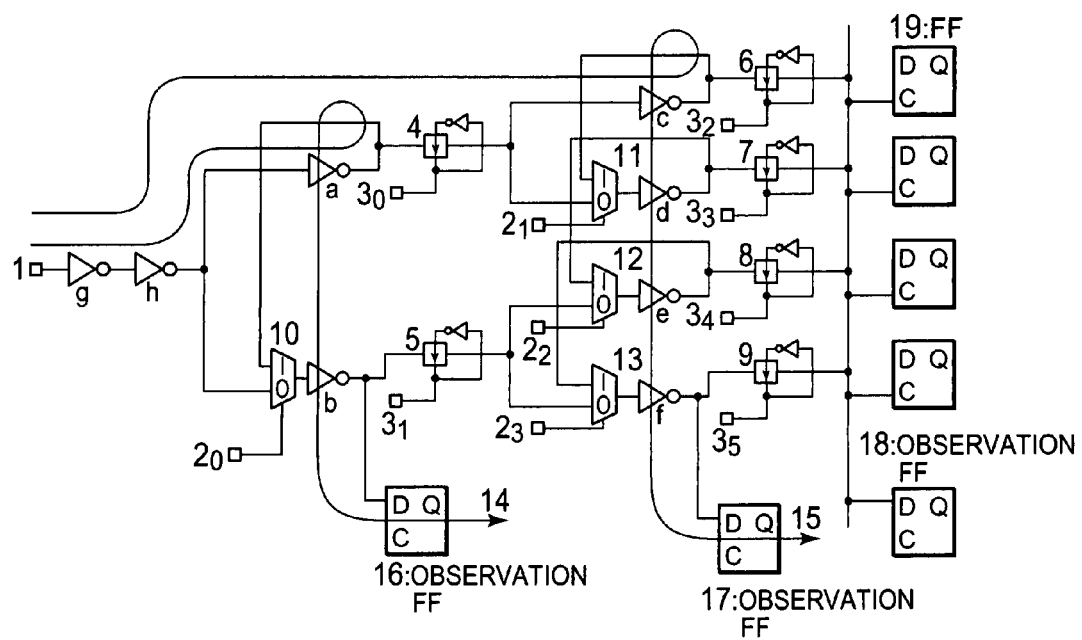
FIG. 1 is a view illustrating a configuration of a first embodiment of the present invention.

The present invention described above will be described in more detail with reference to the accompanying drawings. According to the present invention, in a clock distribution circuit in which outputs of a plurality of buffers in a final stage are short-circuited, in relation to a plurality of buffers in the same stage on a path which branches at a branch node (in FIG. 1, an inverter which is an inverting buffer) (a, b), switches (4, 5) for connecting and disconnecting between them (a, b) and buffers (inverter) (c, d, e, f) in a subsequent stage, and in relation to buffers (inverter) (c, d, e, f) in a final stage, switches (6, 7, 8, 9) for connecting and disconnecting between them (c, d, e, f) and a flip-flop (19) in a subsequent stage are provided, correspondingly to each buffer (inverter). Moreover, in relation to the plurality of buffers (inverter) in the same stage to be connected in a chain-connection, selectors (10), (11, 12, 13) for receiving outputs of adjacent buffers (inverter) (a), (c, d, e) located upstream and a signal at the corresponding branch node by a first input and a second input, and selecting one input based on a select control signal are provided, correspondingly to each of the buffers (inverter) (b), (d, e, f), and the inverters (b), (d, e, f) receive outputs of the corresponding selectors (10), (11, 12, 13), respectively.

Each of flip-flops (19) is one of destination circuit which is distributed clock signal by clock distribution circuit of the present invention.

Upon testing, a chain-connection is formed in a manner that a signal at the branch node is input, directly or indirectly through the selector, to one buffer (inverter) of the plurality of inverters in the same stage (the starting point in the chain-connection), and then an output thereof is input to an adjacent buffer (inverter) through an adjacent selector (the first input is selected) located downstream in the chain-connection. Also, flip-flop circuits (16, 17) for observation are provided to sample an output of a buffer (inverter) at an ending point in the chain-connection. The flip-flop circuits (16, 17) for observation are directly connected to the outputs of the buffers (b), (f) at the ending point in the chain-connection. Upon testing of the buffers (b), (f) at the ending point in the chain-connection, the signal at the branch node is selected and input by the corresponding selectors (10), (13). In such a way, according to the present invention, the clock distribution circuit having the mesh structure in which outputs are short-circuited is configured in a manner that the switch for disconnecting short-circuit wiring and the selector are provided, and upon testing, the clock buffers are connected in the chain-connection to detect a failure. Now, embodiments will be described hereinafter.

Embodiment

FIG. 1 is a view illustrating a configuration of a clock distribution circuit having a mesh structure of one embodiment of the present invention, and shows one example composed of an inverter circuit. Referring to FIG. 1, this embodiment is a clock distribution circuit in which outputs of a plurality of inverters in a final stage are short-circuited, including, in relation to first and second inverters (a), (b) on a path which branches into a first path and a second path at a branch node (output of an inverter (h)):

a transfer gate 4 being a first switch for controlling connection between an output of the first inverter (a) and inputs of inverters (c), (d) in a subsequent stage, a transfer gate 5 being a second switch for controlling connection between an output of the second inverter (b) and inputs of inverters (e), (f) in a subsequent stage, a first selector 10 which receives the output of the first inverter (a) by a first input and a signal at the branch node (the output of the inverter (h)) by a second input, and selects one of the first input and the second input to output, based on a select control signal at a terminal 20, and a flip-flop circuit 16 for observation to sample an output of the first selector 10.

This embodiment includes, in relation to third and fourth inverters (c), (d) on a path which branches into a third path and a fourth path at a second branch node where an output of the first switch (transfer gate) 4 is provided:

a transfer gate 6 being a third switch for controlling connection between an output of the third inverter (c) and an input of a flip-flop 19 in a subsequent stage, a transfer gate 7 being a fourth switch for controlling connection between an output of the fourth inverter (d) and an input of the flip-flop 19 in the subsequent stage, and a second selector 11 which receives the output of the third inverter (c) by a first input and a signal at the second branch node by a second input, and selects one of the first input and the second input, based on a second select control signal at a terminal 21.

This embodiment further includes, in relation to fifth and sixth inverters (e), (f) on a path which branches into a fifth path and a sixth path at a third branch node where an output of the second switch (transfer gate) 5 is provided:

a transfer gate 8 being a fifth switch for controlling connection between an output of the fifth inverter (e) and an input of the flip-flop 19 in the subsequent stage, a transfer gate 9 being a sixth switch for controlling connection between an output of the sixth inverter (f) and an input of the flip-flop 19 in the subsequent stage, a third selector 12 which receives the output of the fourth inverter (d) by a first input and a signal at the third branch node by a second input, and selects one of the first input and the second input, based on a third control signal at a terminal 22, a fourth selector 13 which receives the output of the fifth inverter (e) by a first input and the signal at the third branch node by a second input, and selects one of the first input and the second input, based on a fourth control signal at a terminal 23, and a second flip-flop circuit 17 for observation to sample an output of the sixth inverter (f). One terminal of each of the transfer gates 6 to 9 is connected to the inverters (c), (d), (e), (f) in the final stage and the other terminal of each of the transfer gates 6 to 9 is connected in common to clock input terminals (C) of a plurality of the flip-flops 19, and also connected to a data input terminal (D) of the flip-flop 18 for observation.

In FIG. 1, the transfer gates 4 to 9 are formed of a CMOS transfer gate composed of a NMOS transistor and a PMOS transistor, and each of the transfer gates is turned on when control signals at terminals 30 to 35 are in a high level, and it is turned off when the control signals are in a low level. The transfer gates 4, 5 are connected between the outputs of the inverters (a), (b) and the inputs of the inverters (c) to (f) in the subsequent stage, the transfer gates 6 to 9 are respectively connected between the outputs of the inverters (c) to (f) and the inputs of the flip-flops 19, and when a mode is changed, a path from the inverter to the subsequent is disconnected. Upon a test mode, the selector 10 and the selectors 11, 12, 13 interconnect the inverters in the chain-connection to make paths 14, 15.

In FIG. 1, each of the outputs of the inverters (a), (b), (c), (d), (e), (f) being an element of the clock distribution circuit having the mesh structure is connected to the input of the corresponding transfer gates 4, 5, 6, 7, 8, 9, further, each of the outputs of the inverters (a), (c), (d), (e) is connected to "1" input of corresponding the selectors 10, 11, 12, 13, the output of the transfer gate 4 is connected to a "0" input of the selector 11, the output of the transfer gate 5 is connected to "0" inputs of the selectors 12, 13, and a signal at a terminal 1 is connected to a "0" input of the selector 10 through inverters (g), (h) in two stage. The selector selects the "1" input when the select control signal provided is "1", and selects the "0" input when the select control signal provided is "0".

Connecting nodes between the outputs of the inverters (b), (f) and the inputs of the transfer gates 5, 9 are connected respectively to the flip-flops (FF) 16, 17 for observation to detect a failure.

A path to a subsequent stage can be disconnected by setting the transfer gates 4 to 9 to an off-state.

By selecting the "1" input in the selectors 10 to 13, the inverter (a) and the inverter (b) are connected in the chain-connection, and the inverters (c), (d), (e), (f) are connected in the chain-connection.

An FF 18 is a flip-flop (FF) for observation which is connected to a final stage of a clock tree, observes a signal transferred through any of the transfer gates 6 to 9, and detects a failure in the transfer gates 6 to 9.

An inspection (test) method for a clock distribution circuit having a mesh structure will be described together with operation in this embodiment. For example, whether each element constituting the clock distribution circuit of the mesh structure breaks down or not is checked.

One example for inspection procedures of this embodiment will be described with reference to FIG. 1.

1. Turn on the transfer gates 4, 5, 9, and turn off the transfer gates 6, 7, 8 to block the output signals of the inverters (c), (d), (e) from flowing into the transfer gate 9.
2. Switch to the "0" input in the selector 10, apply a pulse to the terminal 1, thereby form a path: terminal 1—inverter (g)—inverter (h)—selector 10—inverter (b)—FF 16, observe a signal transferred on this path using the FF 16 and detect a failure on this path.
3. Next, switch to the "1" input in the selector 10, and select a configuration in which relay inverters (a), (b) in the same stage are connected in the chain-connection.
4. Apply a pulse to the terminal 1, observe a signal transferred along a line 14: terminal 1—inverter (g)—inverter (h)—relay inverter (a)—selector 10—relay inverter (b)—FF 16, using the FF 16, and detect a failure on this path.
5. Switch to the "0" input in the selector 13.
6. Apply a pulse to the terminal 1, observe a signal transferred on a path: terminal 1—inverter (g)—inverter (h)—relay inverter (a)—selector 10—relay inverter (b)—transfer gate 5—selector 13—inverter (f)—FF 17, using the FF 17, and detect a failure on this path.
7. Next, switch to the "0" input in the selector 12, and switch to the "1" input in the selector 13.
8. Apply a pulse to the terminal 1, observe a signal transferred on a path: terminal 1—inverter (g)—inverter (h)—relay inverter (a)—selector 10—relay inverter (b)—transfer gate 5—selector 12—inverter (e)—selector 13—inverter (f)—FF 17, and detect a failure on this path.
9. Next, switch to the "0" input in the selector 11, switch to the "1" input in the selector 12 and switch to the "1" input in the selector 13.
10. Apply a pulse to the terminal 1, observe a signal transferred on a path: terminal 1—inverter (g)—inverter (h)—relay inverter (a)—transfer gate 4—selector 11—inverter (d)—selector 12—inverter (e)—selector 13—inverter (f)—FF 17, using the FF 17, and detect a failure on this path.
11. Next, switch to the "1" input in the selector 11, switch to the "1" input in the selector 12 and switch to the "1" input in the selector 13.
12. Apply a pulse to the terminal 1, observe a signal transferred along a line 15: terminal 1—inverter (g)—inverter (h)—relay inverter (a)—transfer gate 4—inverter (c)—selector 11—inverter (d)—selector 12—inverter (e)—selector 13—inverter (f)—FF 17, using the FF 17, and detect a failure on this path.
13. Finally, under the conditions of the item 12, turn on the transfer gates 6 to 9 one-by-one in turn, observe a signal transferred to the FF 18 using the FF 18, and detect a failure in the transfer gates 6 to 9.

According to the inspection procedures described above, a failure in the clock distribution circuit of the mesh structure can be detected.

Figure 4:
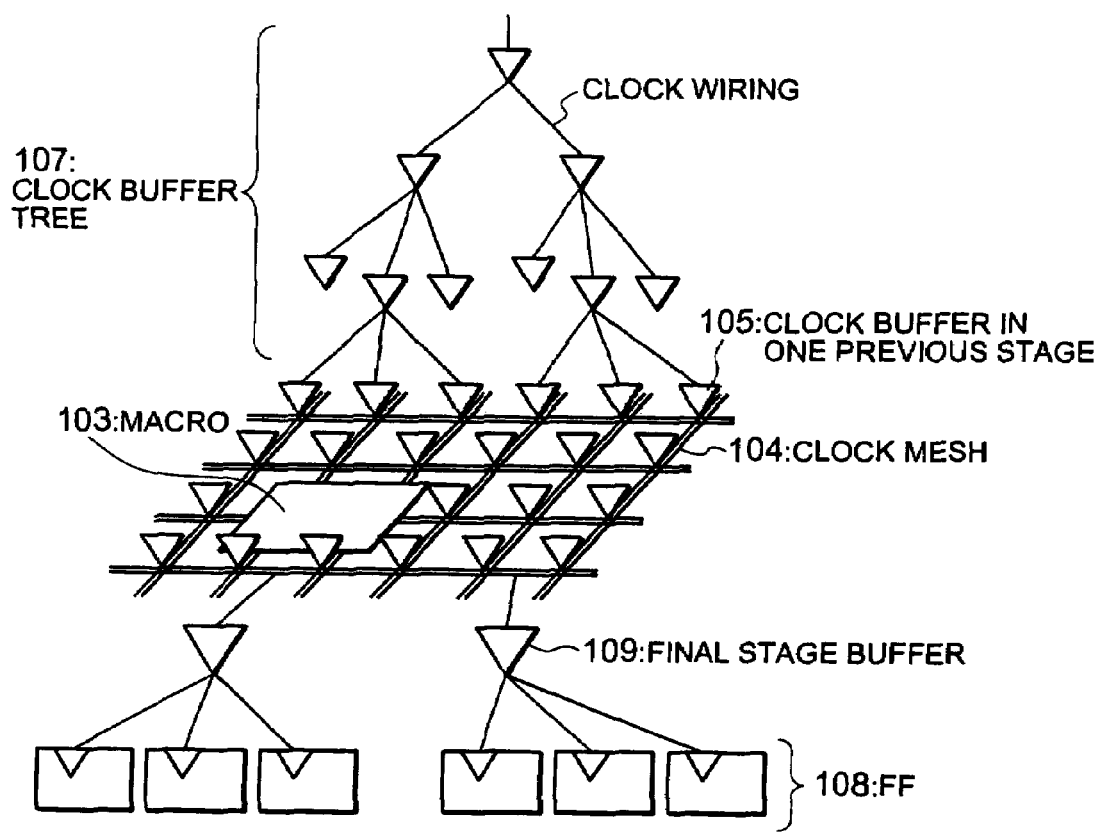
FIG. 4 is a view schematically illustrating a configuration of a conventional mesh clock distribution structure.

In a case of a conventional circuit configuration shown in FIG. 4, all outputs of buffers (invertors) forming each element constituting a mesh structure are short-circuited, so that even if one buffer breaks down, voltage level of wiring in the mesh structure is changed depending on the outputs of the buffers which do not break down, therefore the buffer which broke down can not be detected.

On the contrary, according to this embodiment, because the buffers in the same stage are configured in the chain-connection, it can be checked whether the buffer breaks down or not.

Figure 2:
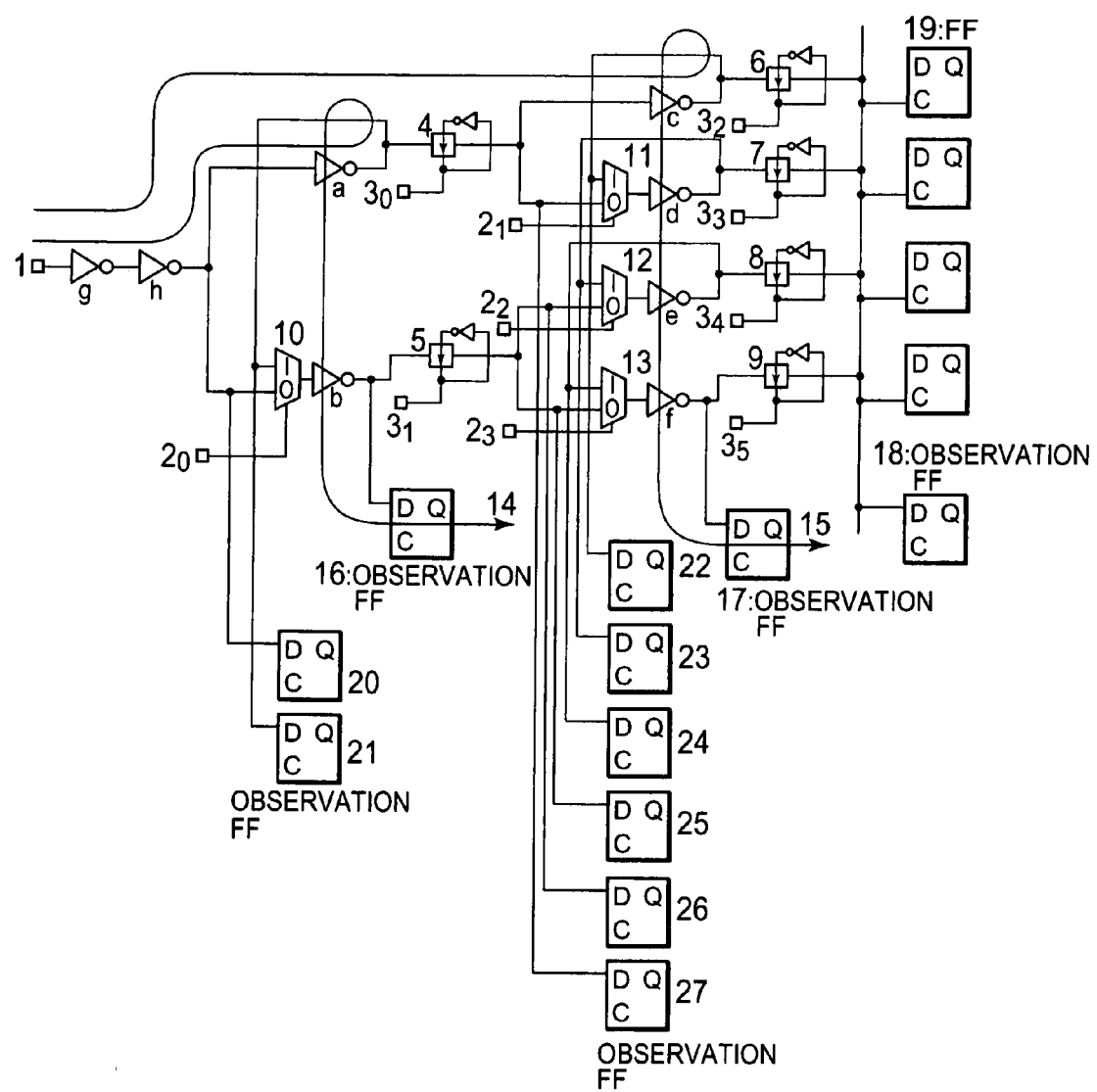
FIG. 2 is a view illustrating a configuration of a second embodiment of the present invention.

FIG. 2 is a view illustrating a configuration of a second embodiment of the present invention. In FIG. 2, for a "0" input and a "1" input of a selector 10, flip-flops (FF) for observation 20, 21 are provided respectively, and for "0" inputs and "1" inputs of selectors 11, 12, 13, flip-flops (FF) for observation 22, 23, 24, 25, 26, 27 are provided respectively.

One example for inspection (test) procedures of this embodiment will be described with reference to FIG. 2.

1. Turn on transfer gates 4, 5, 9, and turn off transfer gates 6, 7, 8 to block outputs of inverters (c), (d), (e) from flowing into the transfer gate 9.
2. By switching to the "0" input in the selector 10, applying a pulse to a terminal 1, and observing a signal transferred on a path: terminal 1—inverter (g)—inverter (h)—selector 10—inverter (b)—FF 16, using the FF 16 and the FF 20, it can be confirmed whether or not a signal is input to the "0" input of the selector 10, and the inverter (b) correctly outputs.
3. Next, switch to the "1" input in the selector 10, and select a configuration in which relay inverters (a), (b) in the same stage are connected in a chain-connection.
4. By applying a pulse to the terminal 1, and observing a signal transferred along a line 14: terminal 1—inverter (g)—inverter (h)—relay inverter (a)—selector 10—relay inverter (b)—FF 16, using not only the FF 16, but also the FF 21 to sample the "1" input of the selector 10, it can be confirmed whether or not:
(1) the inverter (a) outputs correctly, and
(2) a signal is input to the "1" input of the selector 10.
5. Switch to the "0" input in the selector 13.
6. By applying a pulse to the terminal 1, and observing a signal transferred on a path: terminal 1—inverter (g)—inverter (h)—relay inverter (a)—selector 10—relay inverter (b)—transfer gate 5—selector 13—inverter (f)—FF 17, using not only the FF 17, but also the FF 25 and the FF 26, it can be confirmed whether or not:
(1) a signal is input to the "0" inputs of the selectors 12, 13,
(2) the inverter (f) outputs correctly, and
(3) a failure occurs in the transfer gate 5.
7. Next, switch to the "0" input in the selector 12, and switch to the "1" input in the selector 13.
8. By applying a pulse to the terminal 1, and observing a signal transferred on a path: terminal 1—inverter (g)—inverter (h)—relay inverter (a)—selector 10—relay inverter (b)—transfer gate 5—selector 12—inverter (e)—selector 13—inverter (f)—FF 17, using not only the FF 17, but also the FF 24, it can be confirmed whether or not:
(1) the inverter (e) outputs correctly, and
(2) a signal is input to the "1" input of the selector 13.
9. Next, switch to the "0" input in the selector 11, switch to the "1" input in the selector 12 and switch to the "1" input in the selector 13.
10. By applying a pulse to the terminal 1, and observing a signal transferred on a path: terminal 1—inverter (g)—inverter (h)—relay inverter (a)—transfer gate 4—selector 11—inverter (d)—selector 12—inverter (e)—selector 13—inverter (f)—FF 17, using not only the FF 17, but also the FF 23 and the FF 27, it can be confirmed whether or not:
(1) a failure occurs in the transfer gate 4,
(2) a signal is input to the "0" input of the selector 11,
(3) the inverter (d) outputs correctly, and
(4) a signal is input to the "1" input of the selector 12.
11. Next, switch to the "1" input in the selector 11, switch to the "1" input in the selector 12 and switch to the "1" input in the selector 13.
12. By apply a pulse to the terminal 1, and observing a signal transferred along a line 15: terminal 1—inverter (g)—inverter (h)—relay inverter (a)—transfer gate 4—inverter (c)—selector 11—inverter (d)—selector 12—inverter (e)—selector 13—inverter (f)—FF 17, using not only the FF 17, but also the FF 22, it can be confirmed whether or not:

(1) the inverter (c) outputs correctly, and (2) a signal is input to the "1" input of the selector 11.

13. Finally, under the conditions of the item 12, turn on the transfer gates 6 to 9 one-by-one in turn, observe a signal transferred to the FF 18, and detect a failure in the transfer gates 6 to 9.

In addition, according to the present invention, besides a normal state in which outputs of clock buffers are short-circuited, there may be a state in which the clock buffers are connected in the chain configuration by switching the selectors 10 to 13. Therefore, in addition to the inspection procedures above of the embodiments 1 and 2 respectively described above, by carrying out a pulse circuit test from the terminal 1 to the flip-flop (FF) for observation in the normal state in which the outputs of the clock buffers are short-circuited, and the pulse circuit test from the terminal 1 to the flip-flop (FF) for observation in the state in which the clock buffers are connected in the chain configuration by switching the selectors 10 to 13, a test on each of the clock buffers of which outputs are short-circuited in a mesh array can be performed.

According to the embodiments described above, when a failure occurs in the inverters connected in the chain-connection, it is easy to locate the failure.

As described above, according to the present invention, a failure of the inverter (or a non-inverting clock buffer) which is each element in the clock distribution circuit of the mesh structure can be detected.

In the first and second embodiments shown in FIGS. 1 and 2, short-circuiting is performed in the final stage of the clock distribution circuit of the mesh structure, but short-circuiting is not limited to that in the final stage, for example it may be performed in the middle stage. Further, short-circuiting is performed at one place, but it is obvious that it is not limited to the one place.

Figure 3:
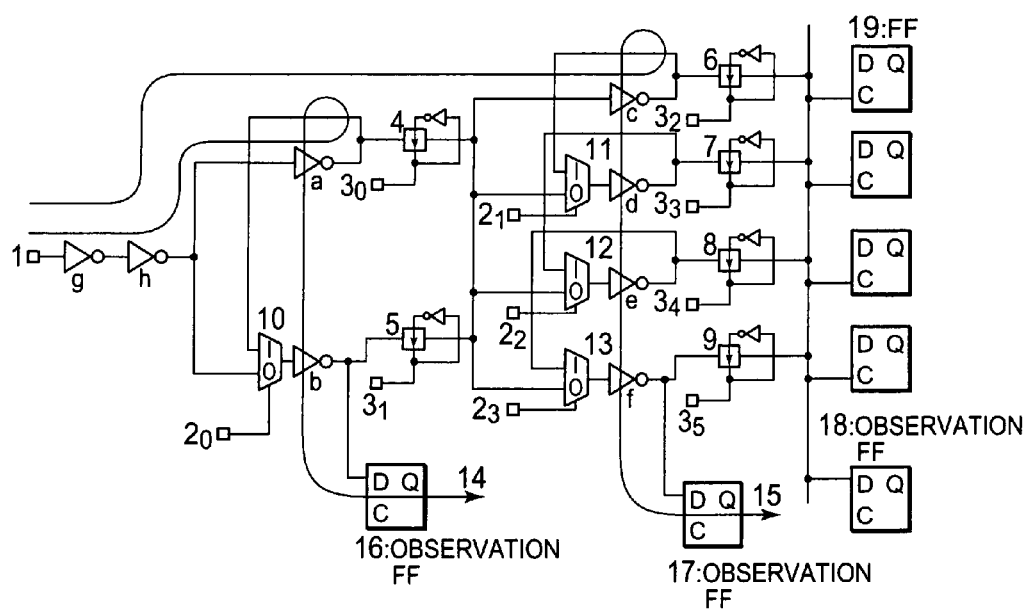
FIG. 3 is a view illustrating a configuration of a third embodiment of the present invention.

FIG. 3 is a view illustrating a configuration of a third embodiment of the present invention. Referring to FIG. 3, in this embodiment, the outputs of the transfer gates 4, 5 are further short-circuited in the configuration of the first embodiment shown in FIG. 1. That is, FIG. 3 shows an example in which, besides short-circuiting in the final stage on the branch path in the clock distribution circuit of the mesh structure, that in the middle stage is also performed. Inspection procedures of this embodiment can follow the inspection procedures described in the first embodiment above. In addition, when a plurality of branch paths in the same stage are short-circuited, the plurality of branch paths may be divided into groups to be respectively short-circuited.

In the first to third embodiments described above, the flip-flops (FF) for observation are used to detect a failure. These FFs for observation may be easily implemented by using, for example, scan path technology for connecting to scan flip-flops in a semiconductor device well known as one of test facilitation designs. In addition, when the scan path technology may not be used, outputs of these flip-flops for observation may be provided to an external pin. Further, means for failure detection described above is not limited to the flip-flops for observation; but any means may be used if it can observe a failure. As an example in which the flip-flops for observation are not used for failure detection, a detection signal may be output solely to an external output pin for monitoring.

Now, the present invention has been described in relation to the embodiments above, but the present invention is not limited to the configurations of the embodiments above, and the present invention obviously include various changes and modifications which those skilled in the art would make within the scope of the present invention.

What is claimed is:

1. A clock distribution circuit having plural stages of buffers disposed along branch paths for dividing up a clock signal and configured in a manner that outputs of a plurality of buffers in a final stage and/or a middle stage are short-circuited, comprising:

in relation to at least one buffer of a plurality of buffers in the same stage on a branch path, a selector for receiving an output of an adjacent buffer located upstream in terms of chain-connection along which the plurality of buffers are connected in testing, and a signal at a branch node corresponding to the at least one buffer by a first input and a second input respectively, selecting one of the first input and the second input based on a select control signal, and supplying the selected input to the one buffer, wherein upon testing, the selector selects the second input, an output of the one buffer is input to the first input of an adjacent selector located downstream in the chain-connection, the first input is selected in the adjacent selector, and the output of the one buffer is input to an adjacent buffer, the output of the one buffer is transferred down to a buffer at an ending point of the chain-connection sequentially through a selector and a buffer located downstream in the chain-connection, and a circuit for observing an output of the buffer at the ending point of the chain-connection is provided.

2. The clock distribution circuit according to claim 1, further comprising:

in relation to the plurality of buffers in the same stage, a switch for disconnecting a connection to a subsequent stage, correspondingly to each of the buffers.

3. The clock distribution circuit according to claim 1, further comprising:

in relation to the plurality of buffers in the same stage, a switch for connecting and disconnecting between one of the buffers and an input of a buffer in a subsequent stage, or between the buffer in said stage and a destination circuit for receiving an output of the buffer in said stage in case where the stage is the final stage of said distribution circuit.

4. The clock distribution circuit according to claim 1, further comprising:

a circuit for individually observing each of the first and second inputs of the selector.

5. The clock distribution circuit according to claim 1, wherein outputs of a plurality of buffers of the same stage in the middle stage on the branch path are short-circuited, and to the first and second inputs of the selector provided in relation to one buffer located in a stage subsequent to the middle stage, the output of the adjacent buffer located upstream when connected in the chain-connection, and a signal at a short-circuiting point of a plurality of buffers in a previous stage corresponding to the one buffer are input.

6. The clock distribution circuit according to claim 1, further comprising:

an observation circuit for observing a signal at a short-circuiting point at which outputs of the plurality of buffers in the final stage are short-circuited.

7. The clock distribution circuit according to claim 1, wherein each of the buffers comprises an inverting buffer including an inverter circuit.

8. A semiconductor integrated circuit device, comprising the clock distribution circuit according to claim 1.

9. The clock distribution circuit according to claim 1, wherein the chain-connection includes a plurality of buffers in a same stage.

10. A clock distribution circuit having plural stages of buffers on a path for dividing up a clock signal, and configured in a manner that outputs of a plurality of buffers in a final stage and/or a middle stage are short-circuited, comprising:
a first buffer and a second buffer respectively on a first path and a second path which branch off of each other at a branch node,
a first switch for connecting and disconnecting between an output of the first buffer, and an input of a buffer in a subsequent stage or a flip-flop,
a second switch for connecting and disconnecting between an output of the second buffer, and an input of a buffer in a subsequent stage or a flip-flop,
a first selector which receives the output of the first buffer and a signal at the branch node respectively by a first input and a second input, and selects one of the first input and the second input to output, based on a select control signal, and
an observation circuit for observing an output of the first selector.

11. clock distribution circuit according to claim 10, further comprising:
a third buffer and a fourth buffer respectively on a third path and a fourth path which branch at a second branch node at which an output of the first switch branches,
a third switch for connecting and disconnecting between an output of the third buffer, and an input of a buffer in a subsequent stage or a flip-flop,
a fourth switch for connecting and disconnecting between an output of the fourth buffer, and an input of a buffer in a subsequent stage or a flip-flop,
a second selector which receives the output of the third buffer and a signal at the second branch node respectively by a first input and a second input, and selects one of the first input and the second input to output, based on a second select control signal,
a fifth buffer and a sixth buffer respectively on a fifth path and a sixth path which branch at a third branch node at which an output of the second switch branches,
a fifth switch for connecting and disconnecting between an output of the fifth buffer, and an input of a buffer in a subsequent stage or a flip-flop,
a sixth switch for connecting and disconnecting between an output of the sixth buffer, and an input of a buffer in a subsequent stage or a flip-flop,
a third selector which receives the output of the fourth buffer and a signal at the third branch node respectively by a first input and a second input, and selects one of the first input and the second input to output, based on a third select control signal,
a fourth selector which receives the output of the fifth buffer by a first input and the signal at the third branch node by a second input, and selects one of the first input and the second input to output, based on a fourth select control signal, and
a second observation circuit for observing the output of the sixth buffer.

12. The clock distribution circuit according to claim 11, further comprising:
a pair of observation circuits for individually observing each of the first and second inputs of the second to fourth selectors, correspondingly to each of the second to fourth selectors.

13. The clock distribution circuit according to claim 10, further comprising:
a pair of observation circuits for individually observing each of the first and second inputs of the first selector.

14. The clock distribution circuit according to claim 10, wherein the observation circuit further includes a flip-flop for sampling a signal to be observed.

15. The clock distribution circuit according to claim 10, wherein the observation circuit includes a circuit for outputting a signal to be observed to an external terminal for monitoring.

16. A test method for a clock distribution circuit having plural stages of buffers along branch paths for dividing up and distributing a clock signal and configured in a manner that outputs of a plurality of buffers in a final stage and/or a middle stage are short-circuited, comprising:
in relation to at least one buffer of a plurality of buffers in the same stage on a branch path, providing a selector which receives an output of an adjacent buffer located upstream in terms of a chain-connection along which the plurality of buffers are connected in testing, and a signal at a branch node corresponding to the one buffer by a first input and a second input respectively, selecting one of the first input and the second input, based on a select control signal, and supplying it to the one buffer;
sequentially transferring an output of the one buffer down to a buffer at an ending point in the chain-connection through a selector and a buffer located downstream in the chain-connection, in a manner that the output of the one buffer is input to the first input of an adjacent selector located downstream in the chain-connection, then in the adjacent selector, the first input is selected, and the output of the one buffer is input to an adjacent buffer; and
observing an output of the buffer at the ending point in the chain-connection.

17. The test method according to claims 16, further comprising in relation to at least one of the plurality of buffers in the same stage on the branch path, supplying a test signal to an input terminal of the clock distribution circuit, with blocking passing to a subsequent stage.

18. The test method according to claims 16, further comprising observing the first and second inputs of the selector, respectively.

19. A clock distribution network, comprising:
a first path having a first buffer carrying clocking information originated from a clock source;
a second path having a second buffer carrying clocking information originated from said clock source; and
a third path coupled to said first and second buffers in sequence,
said first and second paths being activated in common in a first mode of operation; and
said third path being activated in a second mode of operation,
wherein said third path is other than activated in said first mode of operation.

20. The clock distribution network according to claim 19, wherein said first path has one buffer; and
wherein said second path has another buffer having an output which is coupled to an output of said one buffer.

* * * * *

UNITED STATES PATENT AND TRADEMARK OFFICE
CERTIFICATE OF CORRECTION

| | | |
|---|---|---|
| PATENT NO. | : 7,733,079 B2 | Page 1 of 1 |
| APPLICATION NO. | : 11/902746 | |
| DATED | : June 8, 2010 | |
| INVENTOR(S) | : Hidemi Nakashima | |

It is certified that error appears in the above-identified patent and that said Letters Patent is hereby corrected as shown below:

Title Page
(73) Please correct Assignee from NEC Electronics Cofrporation to:

NEC Electronics Corporation

Signed and Sealed this

Twenty-fourth Day of August, 2010

David J. Kappos
*Director of the United States Patent and Trademark Office*